United States Patent [19]
Fiechter et al.

[11] Patent Number: 6,073,684
[45] Date of Patent: Jun. 13, 2000

[54] CLAD CASTING FOR LAPTOP COMPUTERS AND THE LIKE

[75] Inventors: Frederick Charles Fiechter, Wilmington, Del.; Patrick Griffin Quigley, Atlanta, Ga.

[73] Assignee: Applied Thermal Technology, Wilmington, Del.

[21] Appl. No.: 09/028,213

[22] Filed: Feb. 23, 1998

[51] Int. Cl.⁷ ........................... F28D 15/00
[52] U.S. Cl. .................. 165/104.33; 165/185; 361/700; 361/687; 361/705; 257/715
[58] Field of Search ................. 165/905, 80.3, 165/185, 104.33; 257/715; 361/700, 704, 705, 707, 709, 710, 687

[56] References Cited

U.S. PATENT DOCUMENTS

| | | | |
|---|---|---|---|
| 3,061,760 | 10/1962 | Ezzo | 165/80.3 X |
| 3,165,672 | 1/1965 | Gellert | 165/905 X |
| 4,926,242 | 5/1990 | Itoh et al. | 165/905 X |
| 4,941,067 | 7/1990 | Craft | 165/185 X |
| 4,945,451 | 7/1990 | Gohl et al. | 165/80.3 X |
| 5,012,387 | 4/1991 | Ohlenburger | 165/80.3 X |
| 5,191,511 | 3/1993 | Sawaya | 165/80.3 X |
| 5,199,164 | 4/1993 | Kim et al. | 165/80.3 X |
| 5,549,155 | 8/1996 | Meyer, IV et al. | 165/104.33 |
| 5,675,474 | 10/1997 | Nagase et al. | 165/80.3 X |
| 5,826,645 | 10/1998 | Meyer, IV et al. | 165/104.33 |
| 5,847,927 | 12/1998 | Minning et al. | 165/80.3 X |
| 5,870,286 | 2/1999 | Butterbaugh et al. | 165/80.3 X |

*Primary Examiner*—Christopher Atkinson
*Attorney, Agent, or Firm*—Darby & Darby

[57] ABSTRACT

Disclosed is a casing for an electronic device which includes a heat dissipation layer, inner and outer insulative layers along either side of the heat dissipation layer, and a heat pipe which has a portion in thermal-transfer contact with the heat dissipation layer. The heat dissipation layer has a thermal conductivity in a first range whereas the insulative layers have a thermal conductivity in a different, lower range. Preferably, the inner layer is either thicker than the outer layer, has a lower thermal conductivity than the outer layer, or both. Vent holes can be provided through the heat dissipation layer, and, if so, the holes are preferably covered by either the inner or outer layers. Only a portion of the casing need have the foregoing heat dissipation layer, inner and outer insulative layers, and heat pipe.

11 Claims, 3 Drawing Sheets

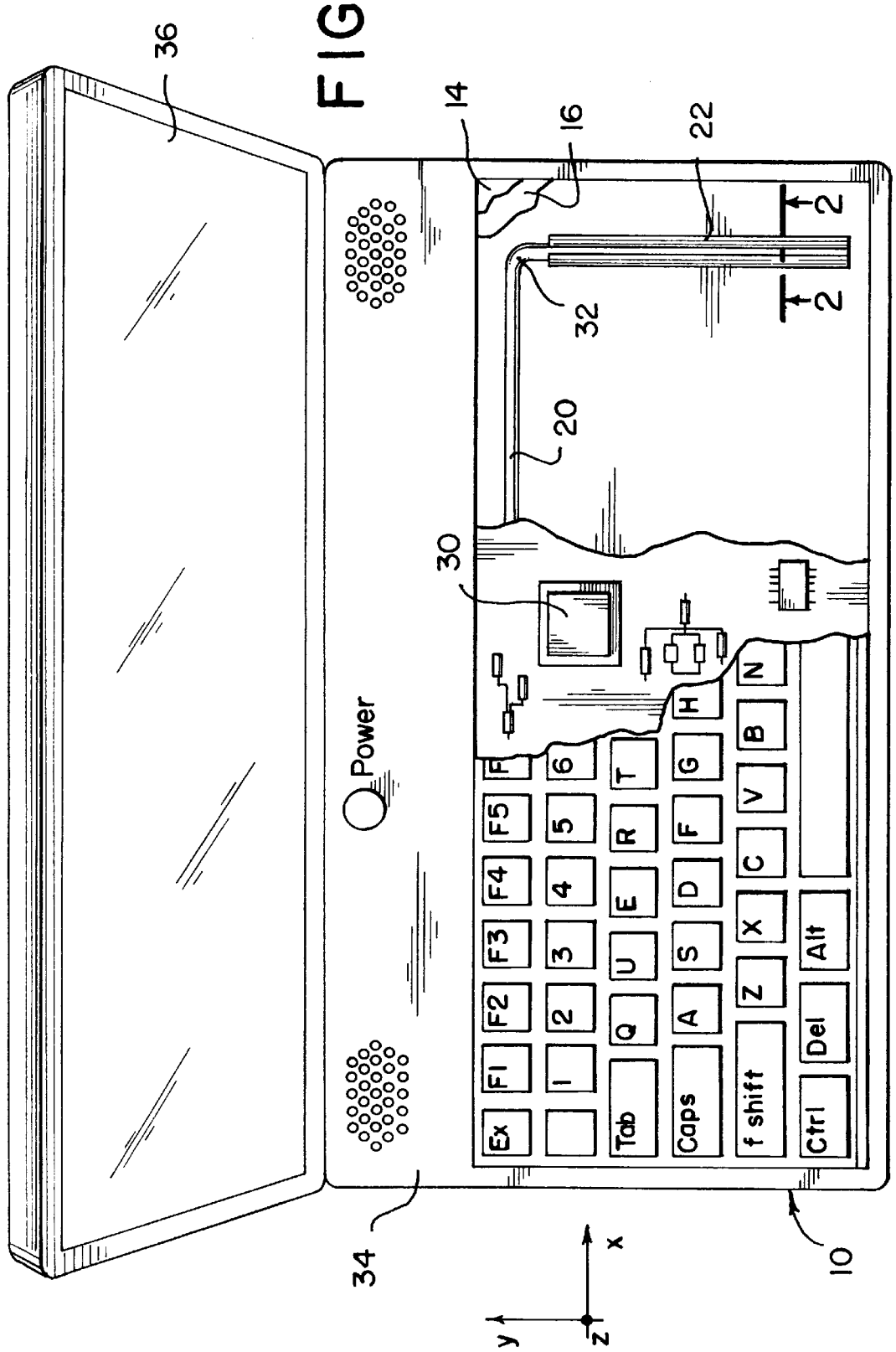

CLAD CASTING FOR LAPTOP COMPUTERS AND THE LIKE

FIELD OF THE INVENTION

The present invention relates to a casing construction for laptop computers and the like, and more particularly to a clad casing which promotes efficient heat transfer away from heat generating components.

BACKGROUND OF THE INVENTION

The heat output of laptop computers, personal digital assistants, cellular telephones and the like (more generally, portable electronic products) is a design consideration that has not been afforded adequate attention in many existing product designs. With regard to laptop computers, some casing designs make no attempt to remove heat from the computer. Others have heat distributed through the case so that there are no hotspots, i.e., a plenum holds the heated air within the casing, sometimes ventilated by way of vent holes and/or a fan. Increases in clock speed and the number of transistors used in modern portable electronic products have increased power consumption demands and overall heat output. Further, it is generally desirable to house portable electronic products in small casings, but such casings impose further constraints on effectively dissipating heat from the closely-packed internal components.

There is a need in the art, which heretofore has not been adequately addressed, for a clad casing that promotes efficient heat transfer. Further, there is a need for such a clad casing which promotes efficient heat transfer from the internal heat-generating components which is passive, that is, does not require power. The present invention addresses these and other needs.

SUMMARY OF THE INVENTION

According to one aspect of the invention, a casing for an electronic device is disclosed which includes a heat dissipation layer, inner and outer insulative layers along either side of the heat dissipation layer, and a heat pipe which has a portion in thermal-transfer contact with the heat dissipation layer. The heat dissipation layer his a thermal conductivity in a first range whereas the insulative layers have a thermal conductivity in a different, lower range.

According to another aspect of invention, only a portion of the casing includes the heat dissipation layer, inner and outer insulative layers, and the heat pipe.

According to yet another aspect of invention, only a portion of the casing includes the heat dissipation layer, the outer insulative layer, and the heat pipe. In lieu of an inner insulative layer, heated air within the casing provides a gradient which directs heat into the heat dissipation layer, where it spreads in the plane of the heat dissipation layer, and out through the outer insulative layer.

According to a preferred aspect of the invention, contact between the heat pipe and the heat dissipation layer is by a support which is in direct thermal-transfer contact with the heat dissipation layer.

According to other aspects of the invention, the casing includes one or more of the following features:

The thermal conductivity of the heat dissipation layer is greater than 15 W/m*K;

The thermal conductivity of the insulating layers is less than 15 W/m*K, and preferably between about 0.01 to about 10 W/m*K;

The inner layer is thicker than the outer layer;

Either or both of the inner and outer layers abuts the heat dissipation layer;

The heat dissipation layer has vent holes therethrough; and

The vent holes are covered by either the inner or outer layers.

IN THE FIGURES

FIG. 3 is a top perspective view of the portable computer of FIG. 1, with portions thereof broken away;

DETAILED DESCRIPTION OF A PREFERRED EMBODIMENT

Figure 1:
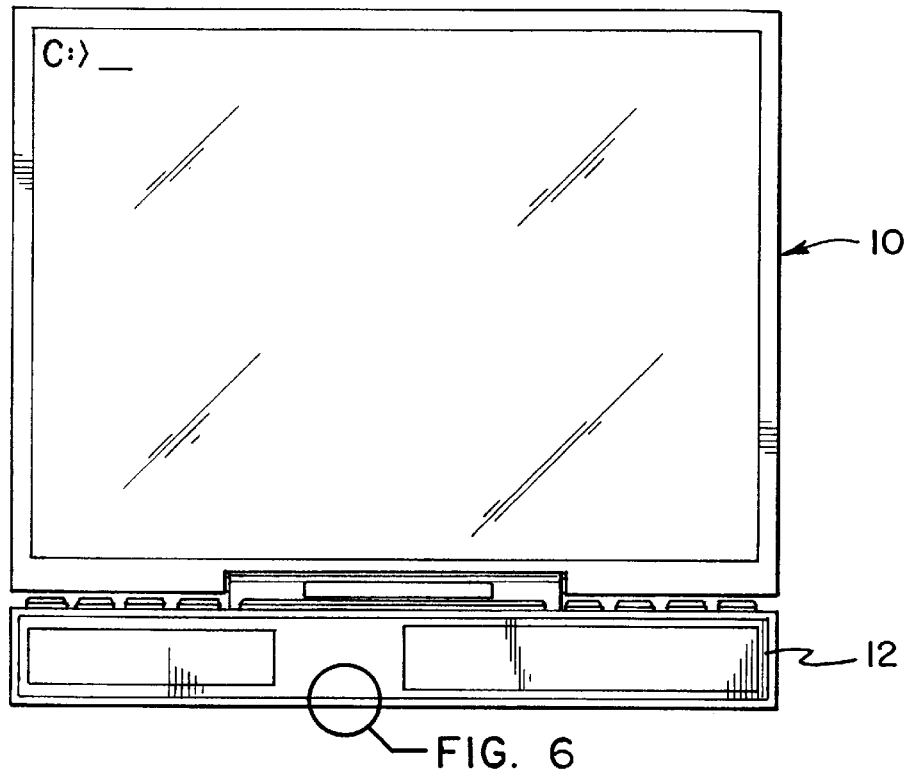
FIG. 1 is a front perspective view of a portable computer having a clad casing in accordance with our invention.

By way of overview and introduction, there is seen in FIG. 1 a laptop computer 10 having a casing 12 comprising plural layers as hereinafter described in detail. However, the invention has utility with a variety of electronic products and portable electronic products, and, for purposes of illustration only, the invention is described herein in connection with a preferred embodiment.

The plural layers of the casing 12 each have a thickness and thermal characteristic selected to promote heat transfer from the internal regions of the portable computer 10 to the ambient. A core layer 14 of the casing 12 has a thermal conductivity which permits rapid heat transfer within the plane of that layer (the plane XY as defined by the coordinate axes in FIGS. 2 and 3). Preferably, the material of the core layer 14 has a thermal conductivity greater than 15 W/m*K and a thickness in range of 0.025 mm to 10 mm so that it serves as a heat dissipation layer. The core layer 14 may comprise one or more laminated layers of the same or varying thermal conductivity. For example, the core layer 14 can include one or more of the following materials: aluminum, copper, steel, silver, bronze, and a conductive polymer. The overall thickness of the layer 14 hits a direct impact on the weight of the electronic device in which it is disposed.

Figure 2:
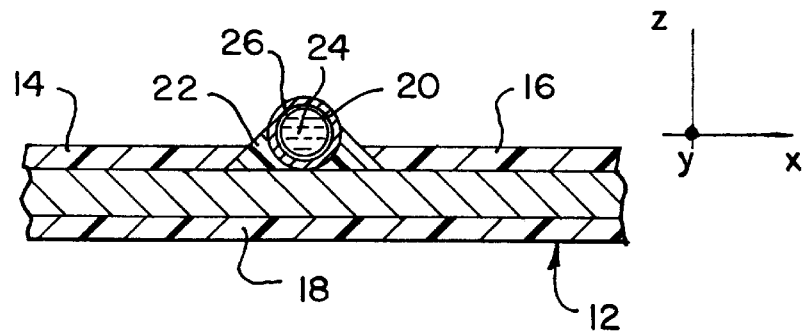
FIG. 2 is a detail view, in section, of a preferred embodiment of our invention taken along the line 2—2 of FIG. 1.

With further reference to FIG. 2, along either side of the core layer 14 are layers 16, 18 of medium thermal conductivity material. Preferably, the layers 16 and 18 are plastic and have a thermal conductivity less than that of the core layer 14, preferably between about 0.01 to about 10 W/m*K. The layer 16 is an inner layer, that is, it is disposed generally adjacent the heat-generating components within the casing 12. The layer 18 is an outer layer which shields or slightly insulates the core layer 14 from the exterior of the case 12 (that is, the ambient). The layers 16 and 1 8 are preferably integral with the core layer 14, as can be achieved by a liquid honing, dipping, chemical or adhesive bonding, or spray technique as understood by those of skill in the art.

The inner layer 16 is preferably configured to provide, more effective insulation than the outer layer 18 so that a temperature gradient is established which promotes heat transfer away from the interior of the laptop computer 10. Each of the layers 16 and 18 is to have an insulative effect on the core layer 14 to promote heat transfer in the plane of the core layer 14, and preferably to have a sufficiently insulative effect so that a generally isothermal temperature is established in the core layer 14. To achieve this, the relative thickness of the inner layer 16 can be made greater than that of the outer layer 18, or the inner layer can have a lower thermal conductivity value, or both. In practice, nylon 66 can be used for both layers 16 and 18 with a thickness for each ranging from about 0.05 mm to about 10.0 mm. In the preferred embodiment, the outer layer 18 is not thick enough to cause a large temperature differential between the exterior of the case and the core layer 14, however is thick enough to slightly insulate the core layer 14, allowing it to leach a nearly isothermal temperature.

In a accordance with the invention, one or more heat pines 20 are provided within the casing 12 and have portions supported by supports 22. The supports 22 are in abutting relationship with portions of the core layer 14. The supports 22 can be made of the same materials as the core layer 14 and should have approximately the same or greater thermal conductivity value as the core layer 14. To enhance thermal contact and the transfer of heat from the heat pipe 20 to the support 22 and from the support 22 to the core layer 14 a thermal grease is preferably used. Preferably, the support 22 is integral with the core layer 14, as will result from an extrusion process. Alternatively, the support 22 can be bonded to the core layer 14 in any conventional manner.

The heat pipe 20 that is mounted on the support 22 can be of conventional design. One suitable heat pipe is available from Thermocore of Allentown, Pa. That heat pipe has a 3 mm diameter, is hollow, is sealed at a reduced atmospheric pressure (e.g., about 0.5 ATM), houses a cotton wick, and is partially filled with water 24. The heat pipe 20 is disposed adjacent a heat generating component within the laptop computer 10 and is heated by that heat source. As a result, the water 24 within the heat pipe 20 boils in the vicinity of the heat source and, due to a temperature differential, the water vapor travels to another portion of the heat pipe which is not as hot. The water vapor condenses at the cooler end of the heat pipe 20, and travels back toward the heat source through a wick 26 by capillary action to again evaporate into a vapor. In this manner, the heat pipe 20 transfers heat from the location of the heat source to another location. Specifically, the heat pipe 20 transfers the heat to the core layer 14 at the interface of the support 22 and the heat pipe 20.

With reference now to FIG. 3, the laptop computer 10 is shown with portions broken away to thereby reveal one significant source of heat generation within the laptop computer, namely the central processing unit (CPU) 30. The heat pipe 20 is disposed generally adjacent the CPU 30. As described above, heat from the CPU 30 causes the water 24 within the heat pipe 20 to boil and propagate through the heat pipe 20 toward the support 22. The supports 22 can be disposed at one or more predetermined locations for transferring heat to the core layer 14. As illustrated in FIG. 3, the support 22 is located along the right margin of the portable computer 10. It is at the junction of the support 22 and the heat pipe 20 where heat is directly transferred from the heat pipe to the high thermal conductivity layer 14. As a result, a portion of the heat generated by the CPU 30 is transferred to the plural layers 12 of the casing at a location along the right margin of the laptop computer 10.

In the absence of the heat pipe 20, circular isothermal lines centered about the CPU 30 would be observed. However, the heat pipe 20 transfers the heat to the right margin of the laptop computer by way of the heat pipe 20 through the support 22 and into the core layer 14 thereby creating a different pattern of isothermal lines. Specifically, heat from within the laptop computer is transferred to the casing 12 at the locations of the supports 22. As described above, the casing 12 according to the invention is configured to preferentially transfer heat from within the laptop computer to predetermined locations on the core layer 14 where the heat spreads in the XY plane and is radiated out through the outer layer 18. Heat is not merely directed from one part of the casing to another; heat is transferred to the ambient.

The diameter of the heat pipe 20 is an important feature of the invention. The larger the heat pipe 20 used, the fewer are needed. A constraint is imposed, however, by the space within the casing. Thus, a trade-off exists between a smaller size (e.g., 1.5 mm) and a greater number of heat pipes 20 to effect heat transfer, and larger heat pipes fewer in number.

With further reference to FIG. 3, heat pipe 20 has a bend 32 which further assists in relocating heat to a different, predetermined location within the portable computer 10. The bend can have any shape so long at the heat pipe 20 does not kink. As understood by those of skill in the art, a kink in the heat pipe compromises the effectiveness of the heat transfer.

Figure 4:
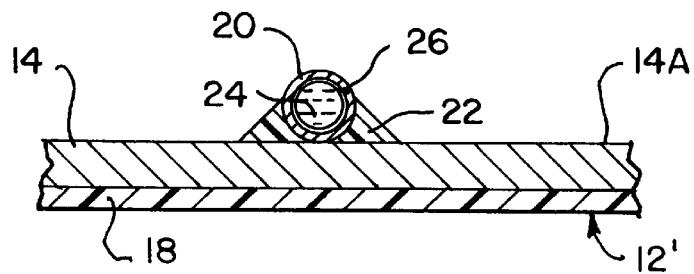
FIG. 4 is a detail view, in section, of a modified embodiment of our invention taken along the line 2—2 of FIG. 1.

With reference now to FIG. 4, a modified embodiment of our invention has a casing 12' including the core layer 14 and the outer layer 18 as the plural layers. An inner layer 16 is not separately provided in accordance with this modified embodiment. Rather, the air within the casing 12' serves, in part, as a thermally insulating layer. Because the core layer 14 is exposed to the heated insulating air layer, when the internal temperature of the laptop computer 10 exceeds the ambient temperature, a temperature differential exists between the inside of the laptop computer 10 and the outside and temperature and heat will flow in the XY plane within the core layer 14 and preferentially dissapate through the outer layer 18 to the ambient. This embodiment is particularly suitable where the internal components of the laptop computer are already insulated from the casing, for example, by a treated paper sheet.

Figure 5:
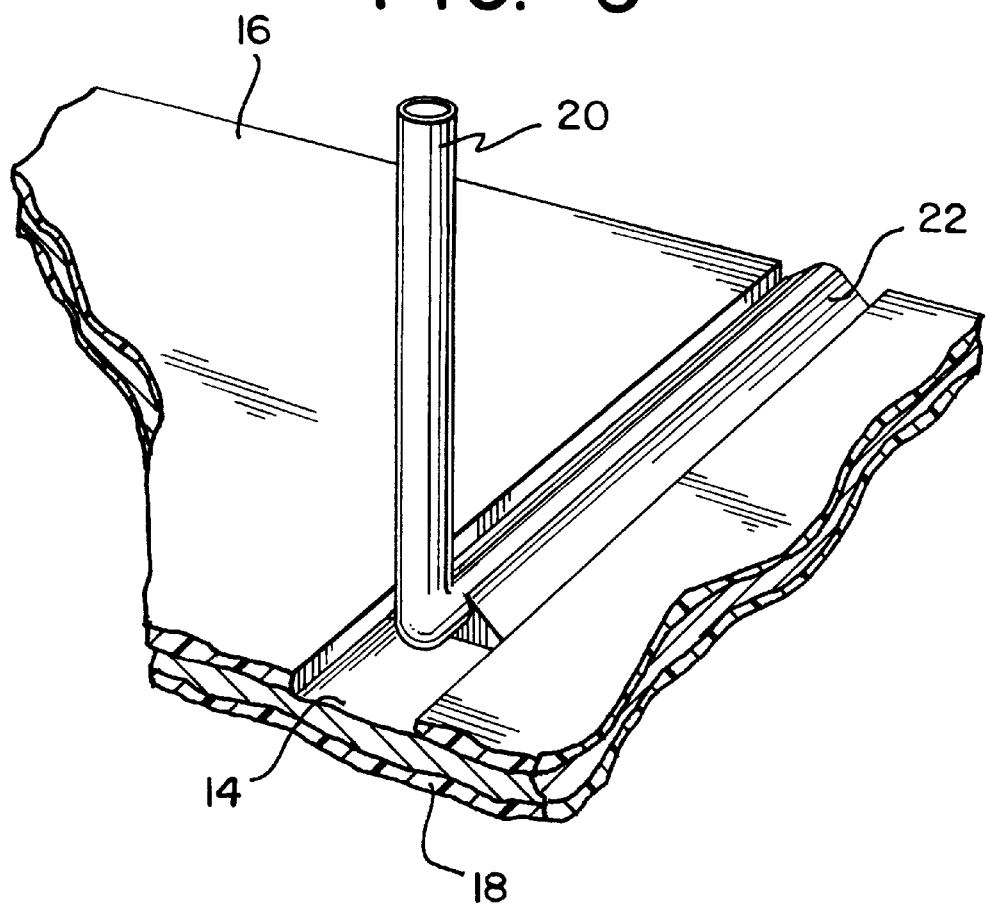
FIG. 5 is a top perspective view of the clad casing according to our invention, showing a heat pipe disposed generally perpendicular to the casing.

Returning now to FIG. 5, the heat pipe 20 is illustrated as being oriented generally perpendicular to the inner layer 16 of the casing. The particular angular orientation of the heat pipe 20 to the support 22 is not critical. The heat pipe 20 can be hingedly connected to the support 22 to effect heat transfer from one plane to another. For example, a heat pipe 20' can transfer heat from the electronics in the main section 34 of the portable computer 10 to the top section 36. This is particularly advantageous where it is reasonably expected that the main section 34 might rest on a hot surface, for example, the lap of the user.

Figure 6:
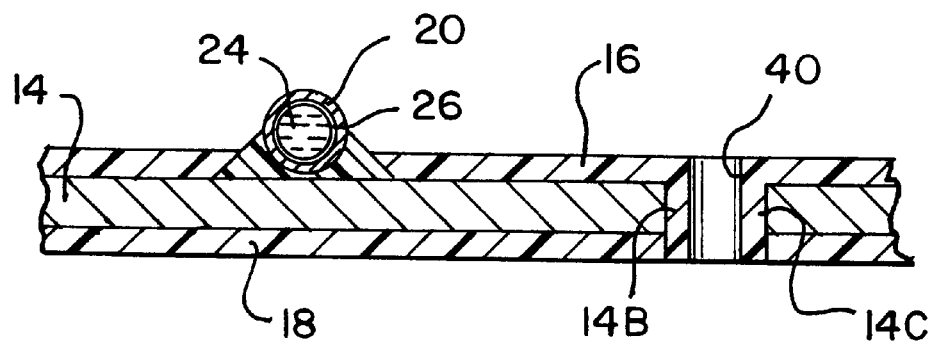
FIG. 6 is a detail view, in section, illustrating an optional vent hole provided through the clad casing of FIG. 1.

In a particular design, it may be desirable to have vent holes through the casing in order to facilitate the outflow of heated air from the inside of the electronic device to the ambient. FIG. 6 illustrates a vent hole 40 which extends through the core layer 14 and the inner layer 16. The outer layer 18 covers the edges 14B and 14C that comprise the sidewalls of the vent hole 40. Alternatively, inner layer 16 can be used to cover the sidewalls 14B, 14C in like manner. Preferably, at least one of the inner and outer layers 16, 18 is applied to the core layer 14 through a liquid honing, spray, dipping, extrusion, or other process. These processes will enable the sidewalls 14B, 14C to be coated directly.

The particular features described above can be arranged on different elements to achieve a clad casing 12 within the spirit of the foregoing disclosure.

Having thus described a preferred embodiment of the present invention, it is to be understood that the above described casing is merely illustrative of the principles of the present invention, and that other arrangements may be devised by those skilled in the art without departing from the spirit and scope of the invention as claimed below.

What is claimed is:

1. A casing for an electronic device, the casing including a clad portion, comprising:

a heat dissipation layer having a plane, first and second surfaces extending along the plane, and a thermal conductivity in a first range;

a support in thermal-transfer contact with the first surface of the heat dissipation layer remote from a heat source;

a heat pipe having a pre-determined portion in contact with the support; and an outer insulative layer along the second surface of the heat dissipation layer and having a thermal conductivity in a second range, whereby heat transferred from the heat source to the heat pipe and then into the heat dissipation layer is promoted to travel in the plane of the heat dissipation layer away from the heat source and through the casing.

2. The casing as in claim 1, wherein the first range of thermal conductivity is greater than 15 W/m*K.

3. The casing as in claim 1, wherein the second range of thermal conductivity is less than 15 W/m*K.

4. The casing as in claim 1, wherein the heat dissipation layer has vent holes therethrough, the sidewalls of the vent holes being covered by the outer layer.

5. The casing as in claim 1, further comprising an inner insulative layer along the first surface of the heat dissipation layer and having a thermal conductivity in a third range.

6. The casing as in claim 5, wherein the second and third range of thermal conductivity are less than 15 W/m*K.

7. The casing as in claim 5, wherein the second and third range of thermal conductivity is about 0.01 to about 10 W/m*K.

8. The casing as in claim 5, wherein the inner layer is thicker than the outer layer.

9. The casing as in claim 5, wherein the inner layer abuts the first surface of the heat dissipation layer.

10. The casing as in claim 5, wherein the outer layer abuts the second surface of the heat dissipation layer.

11. The casing as in claim 5, wherein the heat dissipation layer has vent holes therethrough the sidewalls of the vent holes being covered by one of the inner and outer layers.

* * * * *

UNITED STATES PATENT AND TRADEMARK OFFICE
CERTIFICATE OF CORRECTION

PATENT NO. : 6,073,684
DATED : June 13, 2000
INVENTOR(S) : Frederick Charles FEICHTER et al.

It is certified that error appears in the above-indentified patent and that said Letters Patent is hereby corrected as shown below:

In the "Title", [54], please correct to read:

-- CLAD CASING FOR LAPTOP COMPUTERS AND THE LIKE --

Signed and Sealed this

Seventeenth Day of April, 2001

Attest:

NICHOLAS P. GODICI

*Attesting Officer*       *Acting Director of the United States Patent and Trademark Office*